(12) United States Patent
Baines et al.

(10) Patent No.: US 11,189,716 B2
(45) Date of Patent: Nov. 30, 2021

(54) OPEN TYPE HETEROJUNCTION TRANSISTOR HAVING A REDUCED TRANSITION RESISTANCE

(71) Applicant: Commissariat A L'Energie Atomique et aux Energies Alternatives, Paris (FR)

(72) Inventors: Yannick Baines, Grenoble (FR); Julien Buckley, Grenoble (FR); Rene Escoffier, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/459,942

(22) Filed: Jul. 2, 2019

(65) Prior Publication Data
US 2020/0013887 A1    Jan. 9, 2020

(30) Foreign Application Priority Data
Jul. 3, 2018    (FR) ...................................... 18 56111

(51) Int. Cl.
| H01L 29/778 | (2006.01) |
| H01L 29/417 | (2006.01) |
| H01L 29/423 | (2006.01) |

(52) U.S. Cl.
CPC .... *H01L 29/7786* (2013.01); *H01L 29/41741* (2013.01); *H01L 29/4236* (2013.01)

(58) Field of Classification Search
CPC ........... H01L 29/7786; H01L 29/41741; H01L 29/4236; H01L 29/861; H01L 29/7809; H01L 29/7827; H01L 29/7788; H01L 29/0619; H01L 29/2003; H01L 29/404; H01L 29/41766
See application file for complete search history.

(56) References Cited

U.S. PATENT DOCUMENTS

| 8,664,696 | B2 | 3/2014 | Yoshioka et al. |
| 2009/0278172 | A1* | 11/2009 | Kaya ................... H01L 29/7787 257/192 |

(Continued)

FOREIGN PATENT DOCUMENTS

JP    2008-192701    8/2008

OTHER PUBLICATIONS

French Preliminary Search Report dated Mar. 14, 2019 in French Application 18 56111 filed Jul. 3, 2018 (with English Translation of Categories of Cited Documents & Written Opinion).

*Primary Examiner* — Edward Chin
(74) *Attorney, Agent, or Firm* — Oblon, McClelland, Maier & Neustadt, L.L.P.

(57) ABSTRACT

A normally-off heterojunction field-effect transistor is provided, including a superposition of a first layer, of III-N type, and of a second layer, of III-N type, so as to form a two-dimensional electron gas; a stack of an n-doped third layer making electrical contact with the second layer, and of a p-doped fourth layer placed in contact with and on the third layer, a first conductive electrode and a second conductive electrode making electrical contact with the two-dimensional electron gas; a dielectric layer disposed against a lateral face of the fourth layer; and a control electrode separated from the lateral face of the fourth layer by the dielectric layer.

17 Claims, 3 Drawing Sheets

(56) References Cited

U.S. PATENT DOCUMENTS

2010/0006894 A1* 1/2010 Ohta ................. H01L 29/66734
                                                                                                                             257/192
2010/0283083 A1   11/2010 Niiyama et al.
2014/0332822 A1* 11/2014 Takeya .............. H01L 29/66431
                                                                                                                             257/76
2016/0111497 A1* 4/2016 Simin ................. H01L 29/7786
                                                                                                                             257/365

* cited by examiner

OPEN TYPE HETEROJUNCTION TRANSISTOR HAVING A REDUCED TRANSITION RESISTANCE

The invention relates to electronic components comprising a heterojunction, and in particular to normally-off or enhancement-mode heterojunction transistors. Many electronic applications increasingly require performance to be improved, above all in on-board electronics intended for motor vehicles and ground vehicles, in aeronautics, in medical systems or in home-automation solutions for example. Most of these applications require high-power switches which operate in frequency ranges that frequently are above one megahertz.

An alternative to power switches, notably at high frequencies, is the use of high electron mobility field-effect transistors, also called heterostructure field-effect transistors. Such transistors include a superposition of two semiconductor layers having different bandgaps, which form a quantum well at their interface. Electrons are combined in this quantum well in order to form a two-dimensional electron gas. For reasons related to high-voltage and temperature withstand, these transistors are chosen so to have a wide bandgap.

Among widebandgap HEMTs, transistors based on gallium nitride are very promising. The width of their bandgap results in a higher critical electric field compared to materials conventionally used in electronics, in a high carrier saturation velocity and in a good thermal and chemical stability. The breakdown field of gallium nitride may thus be higher than $2 \times 10^6$ V/cm, this easily allowing compact transistors with breakdown voltages higher than 600 V to be produced. With a lateral transistor, gate/drain breakdown voltage may easily be controlled by suitably choosing the distance between the gate and drain. In addition, such transistors allow very high current densities to be achieved because of the very high electron mobility and high electron density of the interface electron gas.

Document US 2009/0278172 describes a structure comprising a superposition of a substrate, of a buffer layer, of a GaN layer and of an AlGaN layer on the GaN layer. A two-dimensional electron gas is formed at the interface between the GaN and AlGaN layers. A drain electrode and a source electrode are placed on either side of a gate. A trench is formed through the AlGaN layer so that the two-dimensional electron gas is interrupted locally, making the transistor a normally-off transistor. A stack of a dielectric layer and of a metal gate layer is placed in the trench. The source is placed on a stack of a GaN layer doped n-type present on the AlGaN layer, of an InGaN layer formed on the n-type GaN layer, and of another n-type GaN layer formed on the n-type InGaN layer. The gate stack protrudes onto a lateral face of the stack of the layers of n-type GaN and p-type InGaN.

Such a transistor has drawbacks. Thus, the transistor has a relatively high on-state resistance.

The invention aims to solve one or more of these drawbacks. The invention thus relates to a normally-off heterojunction field-effect transistor such as defined in the appended claims.

The invention also relates to the variants of the dependent claims. Those skilled in the art will understand that each of the features of the description or of the dependent claims may be independently combined with the features of an independent claim, without however constituting an intermediate generalization.

Other features and advantages of the invention will become clearly apparent from the description that is given thereof below, by way of completely nonlimiting to indication, with reference to the appended drawings, in which.

Figure 1:
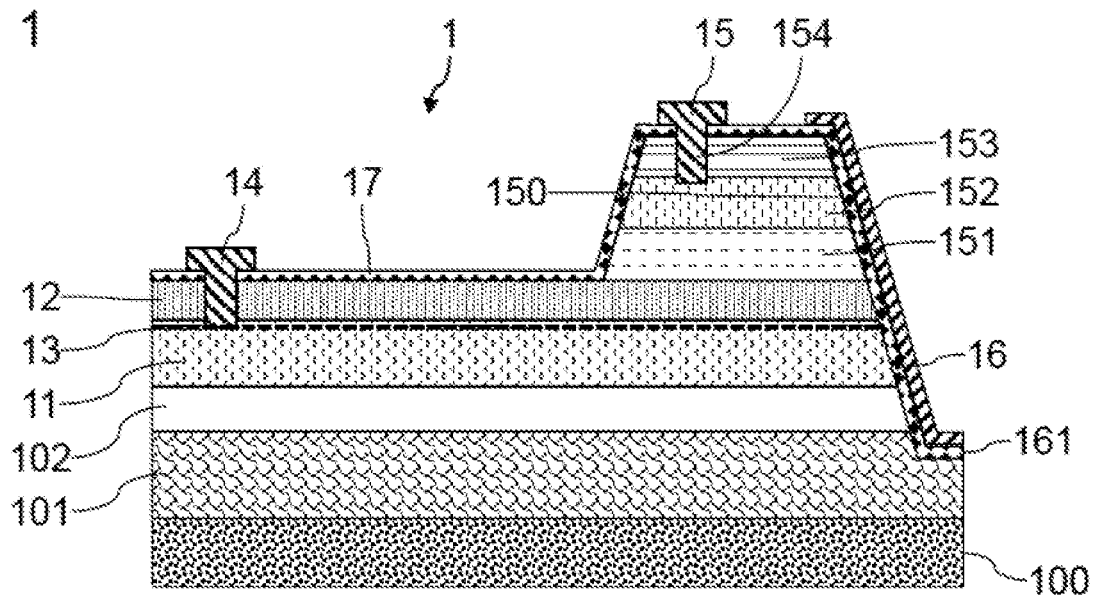
FIG. 1 is a schematic cross-sectional view of an example of a normally-off heterojunction transistor according to one example of a first embodiment of the invention.

FIG. 1 is a schematic cross-sectional view of an example of a normally-off heterojunction transistor 1 according to one example of a first embodiment of the invention. The transistor 1 comprises a barrier layer 12. The barrier layer 12 is here formed on a channel layer 11, so as to form a two-dimensional electron gas 13 at the interface between the layers 11 and 12. For the sake of legibility, the electron gas is illustrated in the form of a layer 13. The layer 11 is here advantageously formed on a stack of layers, which stack is given by way of illustration. The layer 11 is here formed on a buried barrier layer 102. The layer 102 is formed on a charge-trapping layer 101. The charge-trapping layer 101 is formed on a substrate 100. The substrate 100 may be surmounted by a matching layer and/or a buffer layer (which are not illustrated here).

The substrate 100 has a structure known per se. The substrate 100, which may be an insulator or a semiconductor, may be made of doped or intrinsic silicon or of SiC, sapphire or even AlN. The substrate 100 may typically have a thickness of about 350 μm to 1.5 mm.

A matching layer (not illustrated) may be interposed between the substrate 100 and the charge-trapping layer 101. The layer 101 is for example made of carbon-doped GaN or includes $Al_xGa_{(1-x)}N$ layers or other nitride layers.

The layer 102 is for example formed from p-doped GaN. The layer 102 for example has a thickness of about 100 nm. The layer 102 for example has a magnesium concentration comprised between $10^{17}$ cm$^{-3}$ and $6 \times 10^{17}$ cm$^{-3}$, and for example of $5 \times 10^{17}$ cm$^{-3}$.

The channel layer 11 may be formed in a way known per se from III-N semiconductor, for example from unintentionally doped GaN. This layer 11 may for example have a thickness comprised between 50 and 150 nm, and for example of 100 nm.

The barrier layer 12 may be formed in a way known per se from III-N semiconductor, in order to form the two-dimensional electron gas 13 at its interface with the channel layer 11. The barrier layer is for example made of $Al_xGa_{(1-x)}N$, of InAlN, of InGaAlN or of AlN, with a bandgap wider than that of the material of the layer 11. The layer 12 is unintentionally doped. The layer 12 may for example have a thickness comprised between 20 and 30 nm, and for example of 25 nm. A semiconductor layer may be interposed between the layers 11 and 12, for example an AlN layer of a thickness of 1 to 2 nm.

The transistor 1 comprises a conduction electrode 14, making electrical contact with the two-dimensional electron gas 13. The electrode 14 here extends through the layer 12, into contact with the layer 11.

A stack of layers 151 to 153 is formed on the layer 12. This stack is distant from the conduction electrode 14. The stack is here electrically insulated from the electrode 14 by way of a dielectric layer 17. The two-dimensional electron gas 13 extends continuously from the electrode 14 to the vertical of the stack and of the layer 151.

The stack comprises:

an n-type semiconductor layer 151 placed on the layer 12. The layer 151 is for example made of GaN alloy. The layer 151 for example has a thickness comprised between 80 and 150 nm, and for example of 100 nm. The n-type dopant concentration is for example lower than $10^{18}$ cm$^{-3}$; the layer 153/layer 152/layer 151 junction behaves as a flipped MOS transistor with a vertical gate, the thickness of the layer 151 allowing the breakdown voltage of this MOS transistor to be defined;

a p-type semiconductor layer 152 placed in contact on the layer 151. The layer 152 is for example made of GaN alloy. The layer 152 for example has a magnesium concentration comprised between $10^{17}$ cm$^{-3}$ and $8 \times 10^{17}$ cm$^{-3}$, and for example of $7 \times 10^{17}$ cm$^{-3}$. The layer 152 may for example have a thickness comprised between 150 and 250 nm, and for example of 200 nm;

an n-type semiconductor layer 153 placed in contact on the layer 152. The layer 153 is for example made of GaN alloy. The layer 153 for example has a thickness comprised between 15 nm and 70 nm, and for example of 50 nm. The n-type dopant concentration is for example $10^{18}$ cm$^{-3}$. Advantageously, the n-type dopant concentration in the layer 153 is higher than that of the layer 151, so as to decrease the contact resistance of the electrode 15.

The transistor 1 comprises a conduction electrode 15, in electrical contact with the layer 152. The electrode 15 is separated from the layer 151 by at least one portion of the layer 152. In this example, the electrode 15 is placed on the layer 153. The electrode 15 here extends into contact with the layer 152. The electrode 15 here comprises a portion 154 that passes through the layer 153 and that extends into the layer 152. With such a configuration, better electrostatic control of the conduction channel formed in the on state is guaranteed. In addition, this configuration allows a flyback diode to be formed between the electrodes 14 and 15. In the illustrated embodiments, the semiconductor layer 153 is merely optional.

The transistor 1 comprises a dielectric layer 161, notably placed against a lateral face 150 of the layer 152. The dielectric layer 161 is here merged with the dielectric layer 17. The layer 161 is for example made of $Al_2O_3$, and for example has a thickness of 60 nm. The dielectric layer 161 is here covered by a conductive gate 16. The gate length may for example be 15 μm, or even 5 μm.

The conduction electrode 15 is here placed between the conduction electrode 14 and the gate 16. Such a configuration allows the breakdown voltage of the transistor 1 to be increased. It is for example possible to make provision for a distance of at least 10 μm between the electrode 15 and the electrode 14, and preferably of at least 15 μm. Such a configuration allows 650 V to be withstood, i.e. an average field of 0.6 MV per centimeter. Such a configuration also allows a natively normally-off transistor 1 that is able to incorporate an effective flyback diode to be produced in a monolithic cascode manner.

Because of the use of an unintentionally doped layer 12, the risk of diffusion of n-type carriers is avoided. Thus, the mobility of the electrons of the two-dimensional electron gas is not degraded. Because of the use of an unintentionally doped layer, a voltage withstand is also achieved in the thickness of the layer 12 and not solely at the p-n junction. In such a configuration, the on-state resistivity is also lower.

The gate 16 is here formed in a trench 18, which extends through the layer 12. The trench 18 advantageously extends to the interface between the layer 11 and the layer 12. The trench 18 may advantageously extend into the layer 11 to a depth of at least 10 nm, or even through the layer 11: this allows a continuous electrostatic control of all the conduction channel. The trench 18 here extends through the layer 102 and into the layer 101. The dielectric layer 161 is therefore here also formed against a lateral face of the layer 151, against a lateral face of the layer 153, against a lateral face of the layer 12, against a lateral face of the layer 11 and against a lateral face of the layer 102. Such a configuration of the gate 16 notably allows electrostatic control in the layer 12, in particular if the latter is made of AlGaN, a material which is relatively poorly conductive in the on state. The layer 161 is placed between the gate 16 and the lateral faces of the layers 151, 153, 12, 13 and 102.

In the absence of bias on the gate 16, the MOS transistor formed by the combination of the layers 151 to 153 is turned off at Vgs=0 V. The transistor 1 then blocks the passage of current and behaves as a normally-off transistor.

Figure 2:
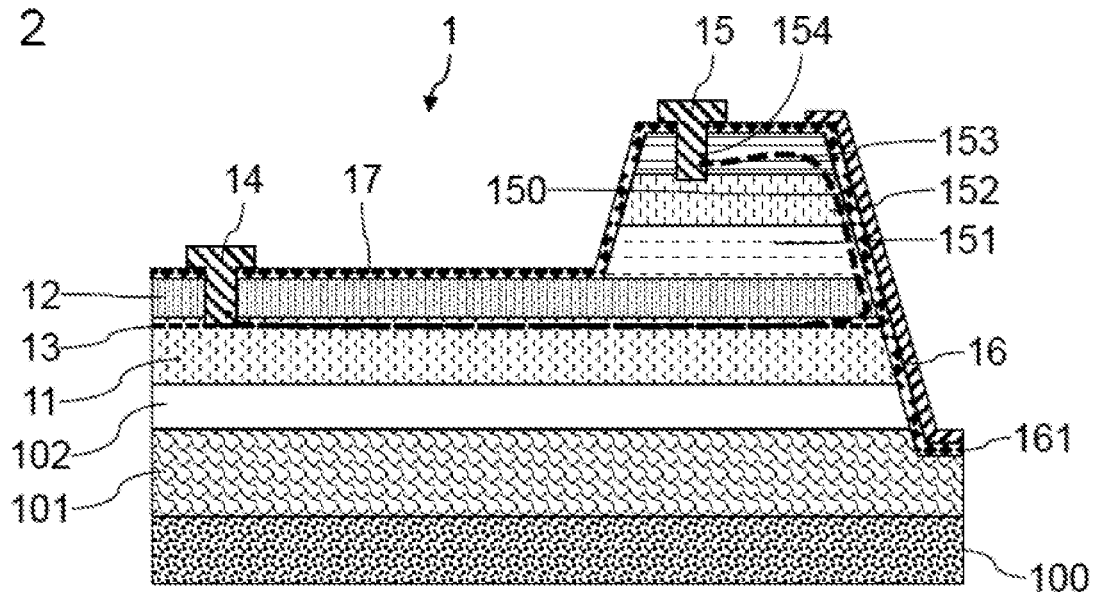
FIG. 2 illustrates the conduction path between two conduction electrodes when the transistor of FIG. 1 is in the on state.

FIG. 2 illustrates the transistor 1 in the on state. Via a suitable bias on the gate 16, the layer 152 is inverted at its lateral face 150, covered by the dielectric layer 161 and facing the gate 16. The conduction path continues through the layers 151 and 12, to the two-dimensional electron gas 13. Because of the continuity of the two-dimensional electron gas between the electrode 14 and the vertical of the stack, and in particular the vertical of the lateral face 150, a very low on-state resistance is obtained, and the breakdown voltage between the electrodes 14 and 15 proves to be particularly high.

Moreover, whereas it could be feared that the layer 152 doped p-type would induce a depletion of the two-dimensional electron gas 13, the presence of the layer 151 doped n-type substantially decreases this depletion effect, while increasing the voltage withstand of the stack.

The transistor 1 of the first embodiment includes a layer 153 doped n-type, which promotes the creation of an electrical contact with the electrode 15 and facilitates the inversion in the layer 152 in order to make it conductive in the on state.

Figure 3:
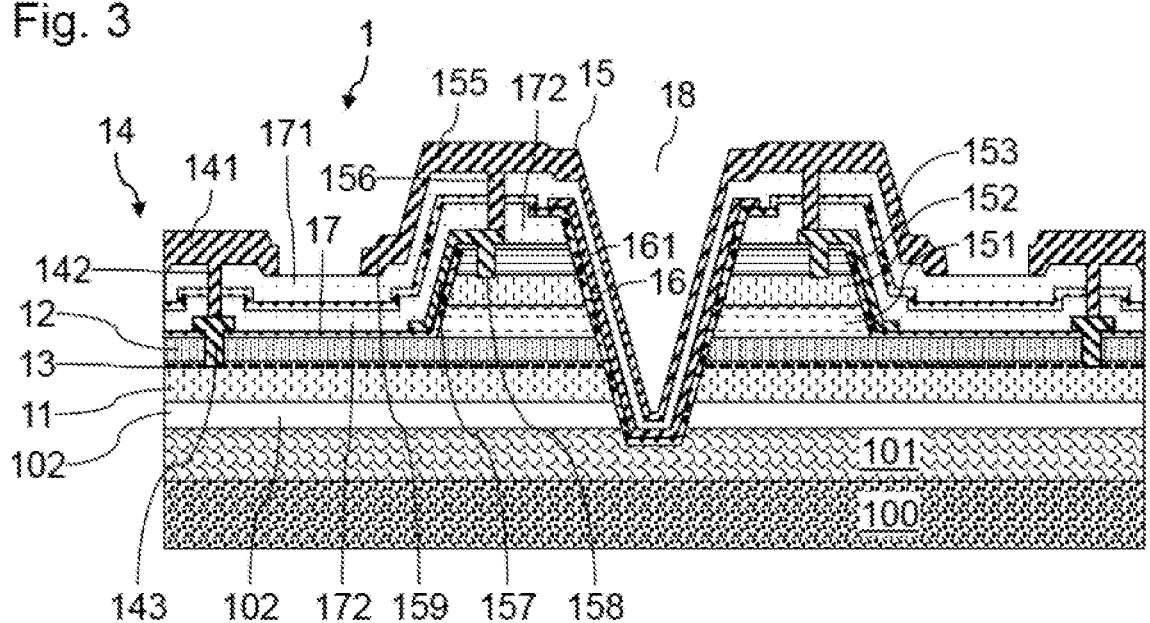
FIG. 3 is a schematic cross-sectional view of an example of a cell including two heterojunction transistors according to one example of a second embodiment of the invention.

FIG. 3 is a schematic cross-sectional view of an example of a cell including two heterojunction transistors according to one example of a second embodiment of the invention. Two transistors 1 are produced symmetrically on either side of a common gate 16. Each transistor 1 comprises the layers 100, 101, 102, 11 and 12 of the first embodiment. Each transistor 1 of this second embodiment also comprises the stack of layers 151, 152 and 153 of the first embodiment.

The electrode 14 here comprises a lower portion identical to the electrode 14 of the first embodiment. The electrode 14 passes through the layer 12 and makes contact with the layer 11. The dielectric layer 17 is here disassociated from the gate insulator 161. A first portion of the electrode 15 has a configuration identical to that of the first embodiment, passes through the layer 153 and makes contact with the layer 152. The electrode 15 here comprises a lateral extension 157 or field plate, placed facing a lateral face of the layers 151, 152 and 153, which lateral face is opposite to the lateral face of these layers 151, 152 and 153 that is located facing the gate 16. Such a configuration of the electrode 15 allows switching of the transistor 1 to the off-state to be facilitated, an electromagnetic screen to be formed and the generated electromagnetic field to be smoothed.

The electrodes 14 and 15 and the dielectric layer 17 are covered by a first passivation layer 172. The first passivation layer 172 is covered by a lateral extension of the gate insulator 161. The gate insulator 161 and the gate 16 are covered by a second passivation layer 171.

The electrode 14 comprises an upper portion 141 placed plumb with a lower portion 143 and positioned on a portion of the second passivation layer 171. The electrode 14 moreover comprises a via 142 connecting the upper portion 141 and the lower portion 143. The via 142 thus passes through the passivation layers 171 and 172 and the gate insulator 161. Advantageously, the orthogonal projection of the upper portion 141 of the electrode 14 onto the layer 12 includes the projection of the lower portion 143 onto the layer 12.

The electrode 15 comprises an upper portion 155 placed plumb with a lower portion 158 and positioned on a portion of the second passivation layer 171. The upper portion 155 comprises a portion 159 extending laterally in the direction of the electrode 14, in order to form a field plate. With respect to the field plate 157, the field plate 159 protrudes by a distance of 50 nm in the direction of the electrode 14. The upper portion 155 also covers the gate 16. Defined otherwise, the orthogonal projection of the upper portion 155 of the electrode 15 onto the layer 12 includes the projection of the lower portion 158 onto the layer 12. The upper portion 155 is separated from the gate 16 by way of the second passivation layer 171. The electrode 15 moreover comprises a via 156 connecting the upper portion 155 and the lower portion 158. The via 156 thus passes through the passivation layers 171 and 172 and the gate insulator 161.

Figure 4:
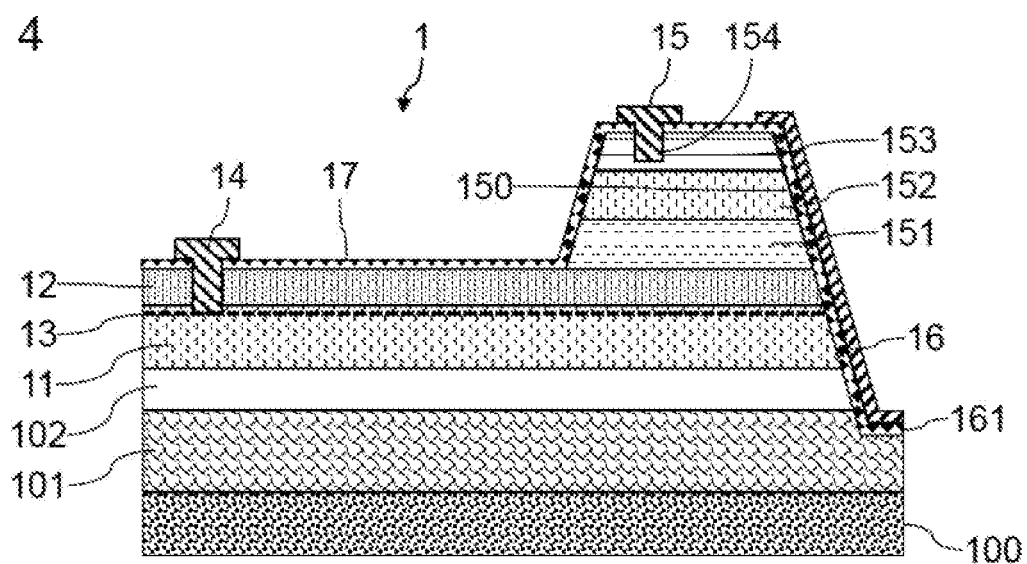
FIG. 4 is a schematic cross-sectional view of one example of a normally-off heterojunction transistor according to one example of a third embodiment of the invention.

FIG. 4 is a schematic cross-sectional view of an example of a normally-off heterojunction transistor 1 according to one example of a third embodiment of the invention. The transistor 1 of FIG. 4 has substantially all the structural and geometric features of the transistor 1 of FIG. 1. The transistor 1 of FIG. 4 differs from that of FIG. 1 only in its electrode 15 which does not extend into contact with the layer 152. A portion of the layer 153 plumb with the electrode 15 here forms a separation between the electrode 15 and the layer 152.

Figure 5:
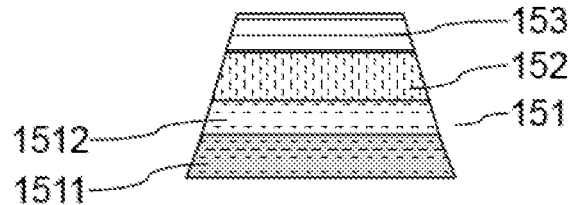
FIG. 5 is a cross-sectional view of a variant of a stack of semiconductor layers for forming a channel of a transistor according to the invention.

FIG. 5 is a schematic cross-sectional view of a stack of the layers 151 to 153 according to one variant of the invention. In this configuration, the layer 151 comprises a first film 1511 making contact with the layer 12, and a second film 1512 placed between the film 1511 and the layer 152. The film 1511 has an n-type dopant concentration higher than that of the film 1512. The film 1511 advantageously has a thickness smaller than that of the film 1512, and typically a thickness of about 10 nm. Such a configuration makes it possible to prevent the layer 151 from having a tendency to deplete the two-dimensional electron gas 13, while providing a relatively large reservoir of electrons for supply of the inversion channel when the transistor 1 is switched to the on state.

Figure 6:
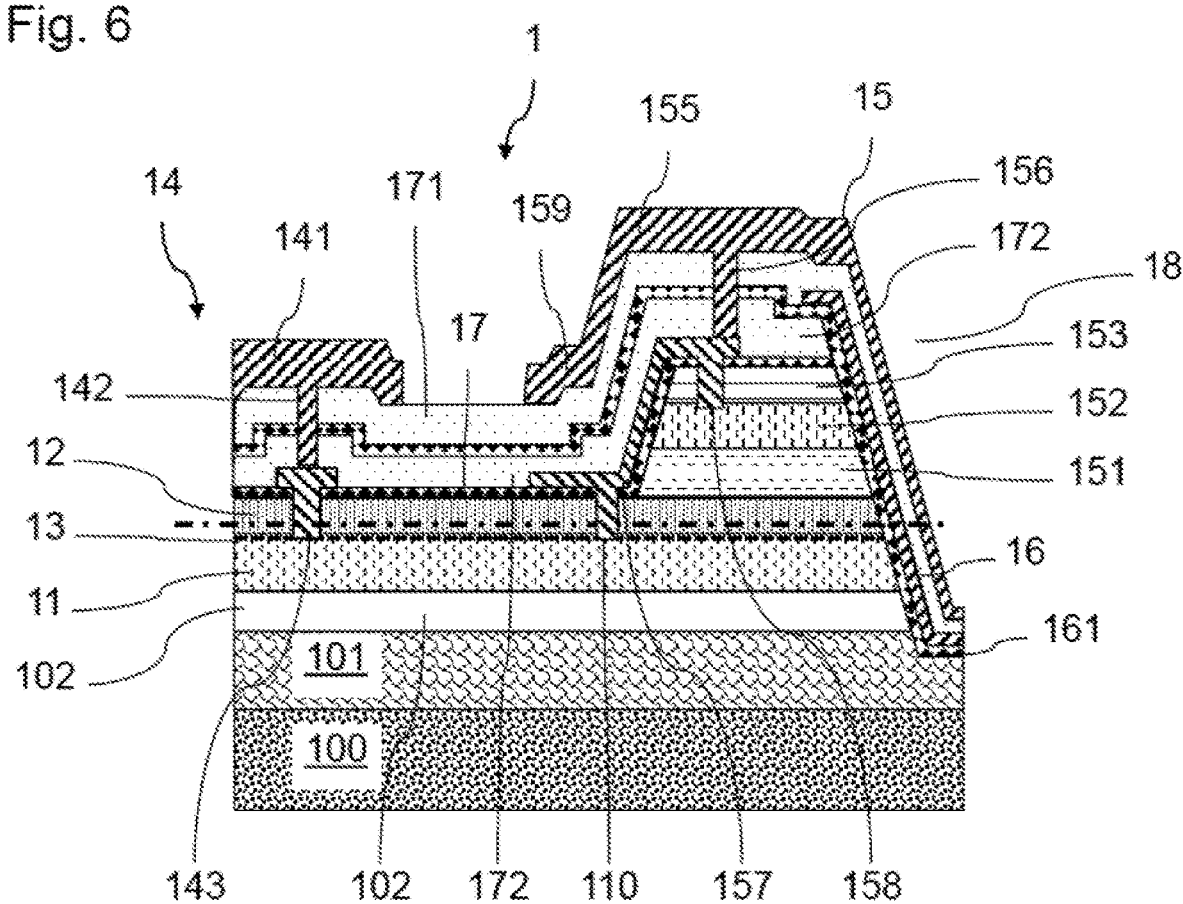
FIGS. 6 and 7 are cross-sectional views of one example of a normally-off heterojunction transistor according to one example of a fourth embodiment of the invention.
Figure 7:
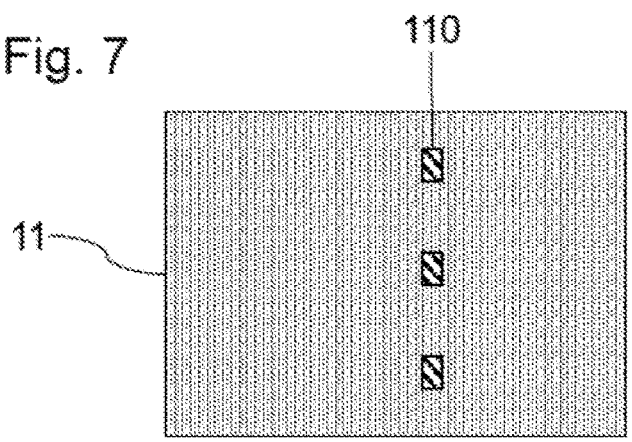

FIGS. 6 and 7 are schematic cross-sectional views of an example of a normally-off heterojunction transistor 1 according to one example of a fourth embodiment of the invention. FIG. 7 is a cross-sectional top view along the dash-dot line in FIG. 6. The transistor 1 of FIG. 6 has substantially the same configuration as the transistors 1 of the second embodiment. The electrode 15 here comprises a lateral extension 157, having one or more Schottky contacts 110 extending through the dielectric layer 17 and through the semiconductor layer 12. Thus, a flyback diode that triggers when the electrode 14 is negatively biased with respect to the electrode 15 is formed, its threshold being independent of the state of the bias on the control gate 16. A screen is formed level with the Schottky contacts 110, by a lateral metal protrusion onto the dielectric layer 17. Thus, a cascode flyback diode is formed. As in the example of FIG. 3, the upper portion 155 comprises a portion 159 that extends laterally in the direction of the electrode 14, in order to form a field plate.

As illustrated in FIG. 7, in order not to excessively perturb the two-dimensional electron gas 13, the contacts 110 are localized and do not interrupt the continuity of the layer 12 between the electrode and the vertical of the stack of layers 151 to 153. In the illustrated example, such Schottky contacts 110 are advantageously combined with the flyback diodes formed by the portion of the electrode 15 making contact with the layer 152.

The invention claimed is:

1. A normally-off heterojunction field-effect transistor, comprising:
   a superposition of a first semiconductor layer, of III-N type, and of a second semiconductor layer, of III-N type, so as to form a two-dimensional electron gas at an interface between the first and the second semiconductor layers;
   a stack of an n-doped third semiconductor layer making electrical contact with the second semiconductor layer, and of a p-doped fourth semiconductor layer disposed in contact with and on the third semiconductor layer;
   a first conductive electrode making electrical contact with the two-dimensional electron gas;
   a second conductive electrode, making electrical contact with the fourth semiconductor layer and separated from the third semiconductor layer by at least one portion of the fourth semiconductor layer;
   a dielectric layer disposed against a lateral face of the fourth semiconductor layer; and
   a control electrode separated from the lateral face of the fourth semiconductor layer by the dielectric layer, the second conductive electrode being positioned between the first conductive electrode and the control electrode; and
   a trench passing through the second semiconductor layer and exposing a lateral face of the second semiconductor layer, wherein
   a portion of the control electrode extends into the trench and extends through the second semiconductor layer into the first semiconductor layer, and
   the portion of the control electrode is disposed to oppose the lateral face of the second semiconductor layer and is separated from the lateral face of the second semiconductor layer by the dielectric layer.

2. The normally-off heterojunction field-effect transistor according to claim 1, wherein the stack further comprises a n-doped fifth semiconductor layer disposed in contact with and on the fourth semiconductor layer, the control electrode being disposed on the fifth semiconductor layer.

3. The normally-off heterojunction field-effect transistor according to claim 2, wherein the second conductive electrode extends into contact with the fourth semiconductor layer.

4. The normally-off heterojunction field-effect transistor according to claim 2, wherein the fifth semiconductor layer has a dopant concentration higher than that of the third semiconductor layer.

5. The normally-off heterojunction field-effect transistor according to claim 1, wherein the second conductive electrode comprises an extension extending into contact with the first semiconductor layer, the second conductive electrode comprising a Schottky contact with the first semiconductor layer.

6. The normally-off heterojunction field-effect transistor according to claim 5, wherein the control electrode extends into the trench, which also passes through the first semiconductor layer.

7. The normally-off heterojunction field-effect transistor according to claim 1, wherein the first and the second semiconductor layers are formed from respective GaN alloys.

8. The normally-off heterojunction field-effect transistor according to claim 1, wherein the two-dimensional electron gas extends continuously between the first conductive electrode and a vertical to the third semiconductor layer.

9. The normally-off heterojunction field-effect transistor according to claim 1, wherein the third and the fourth semiconductor layers are formed from respective GaN alloys.

10. The normally-off heterojunction field-effect transistor according to claim 1, wherein the third semiconductor layer has a dopant concentration higher than that of the fourth semiconductor layer.

11. The normally-off heterojunction field-effect transistor according to claim 1, wherein the third semiconductor layer comprises a first film making contact with the second semiconductor layer and a second film disposed between the first film and the fourth semiconductor layer, the first film having a dopant concentration higher than that of the second film.

12. The normally-off heterojunction field-effect transistor according to claim 1, wherein the second conductive electrode covers most of the fourth semiconductor layer.

13. The normally-off heterojunction field-effect transistor according to claim 1, wherein the second conductive electrode comprises a lower portion and an upper portion, the lower portion being covered with a passivation layer, the second conductive electrode comprising a through-via passing through the passivation layer and connecting the lower portion and the upper portion.

14. The normally-off heterojunction field-effect transistor according to claim 13, wherein an orthogonal projection of the upper portion of the second conductive electrode onto the second semiconductor layer includes a projection of the lower portion of the second conductive electrode onto the second semiconductor layer.

15. The normally-off heterojunction field-effect transistor according to claim 1, wherein the dielectric layer extends continuously from the fourth semiconductor layer to the second semiconductor layer.

16. The normally-off heterojunction field-effect transistor according to claim 1, wherein the control electrode comprises a conductive material that extends continuously from the fourth semiconductor layer to the first semiconductor layer.

17. The normally-off heterojunction field-effect transistor according to claim 1, wherein second semiconductor layer is unintentionally doped.

\* \* \* \* \*